(12) United States Patent
Cullen

(10) Patent No.: US 10,485,145 B2
(45) Date of Patent: Nov. 19, 2019

(54) COOLING SYSTEM FOR ELECTRICAL EQUIPMENT

(71) Applicant: ROLLS-ROYCE plc, London (GB)

(72) Inventor: John J A Cullen, Derby (GB)

(73) Assignee: ROLLS-ROYCE plc, London (GB)

(*) Notice: Subject to any disclaimer, the term of this patent is extended or adjusted under 35 U.S.C. 154(b) by 241 days.

(21) Appl. No.: 15/285,823

(22) Filed: Oct. 5, 2016

(65) Prior Publication Data
US 2017/0127578 A1    May 4, 2017

(30) Foreign Application Priority Data

Nov. 3, 2015    (GB) .................................. 1519392.3

(51) Int. Cl.
| | |
|---|---|
| *H05K 7/20* | (2006.01) |
| *H01B 12/16* | (2006.01) |
| *H02G 3/04* | (2006.01) |
| *H02G 15/34* | (2006.01) |

(52) U.S. Cl.
CPC ......... *H05K 7/20927* (2013.01); *H01B 12/16* (2013.01); *H02G 3/04* (2013.01); *H02G 15/34* (2013.01)

(58) Field of Classification Search
CPC ...... H05K 7/20927; H01B 12/16; H02G 3/04; H02G 15/34
See application file for complete search history.

(56) References Cited

U.S. PATENT DOCUMENTS

| | | | | |
|---|---|---|---|---|
| 2,066,321 A | * | 1/1937 | Bennett ................... | H01F 27/08 174/15.6 |
| 3,162,716 A | * | 12/1964 | Silver .................... | H02G 15/34 174/14 R |
| 3,946,141 A | * | 3/1976 | Schmidt ................. | H01B 7/423 174/11 R |
| 3,950,606 A | * | 4/1976 | Schmidt ................... | H01B 7/29 174/15.5 |
| 4,048,437 A | * | 9/1977 | Vander Arend ........ | H01B 12/16 174/15.5 |
| 4,588,428 A | * | 5/1986 | Kanngiesser .......... | H01B 7/423 165/104.33 |

(Continued)

FOREIGN PATENT DOCUMENTS

EP    2 575 227 A1    4/2013

OTHER PUBLICATIONS

May 12, 2016 Search Report issued in British Patent Application No. 1519392.3.

*Primary Examiner* — Kun Kai Ma
(74) *Attorney, Agent, or Firm* — Oliff PLC

(57) ABSTRACT

This invention concerns a cryo-cooled electrical conduction network. The conduction network has an electrical network divided into two or more conductive sections, each section comprising electrical equipment (24, 28). The conductive network also has a coolant network for maintaining the temperature of a coolant in each section. The electrical equipment (24, 28) and a corresponding portion of the coolant network of each section is housed in a section enclosure (10, 12, 14). The coolant network includes a coolant interface (40) located between each section, wherein the coolant interface (40) is housed in an intermediate enclosure (16, 18, 20, 22) that is isolatable from the section enclosures (10, 12, 14) in the electrical conduction network.

20 Claims, 2 Drawing Sheets

(56) References Cited

U.S. PATENT DOCUMENTS

| | | | | |
|---|---|---|---|---|
| 4,992,623 | A * | 2/1991 | Briley | H01B 12/12 174/15.4 |
| 5,545,932 | A * | 8/1996 | Estop | H01L 39/20 174/125.1 |
| 6,342,673 | B1 * | 1/2002 | Verhaege | H02G 15/34 174/15.4 |
| 8,354,592 | B2 * | 1/2013 | Jang | H01R 4/68 174/125.1 |
| 2004/0256126 | A1 * | 12/2004 | Ashibe | H01R 4/68 174/15.5 |
| 2006/0150639 | A1 * | 7/2006 | Zia | H02G 15/34 62/50.1 |
| 2006/0283620 | A1 * | 12/2006 | Maguire | H01B 12/16 174/125.1 |
| 2012/0229959 | A1 | 9/2012 | Holcomb | |
| 2012/0289405 | A1 | 11/2012 | Lallouet et al. | |
| 2013/0199821 | A1 * | 8/2013 | Teng | H02G 15/34 174/125.1 |
| 2014/0221213 | A1 * | 8/2014 | Fukuda | H01B 12/16 505/163 |

\* cited by examiner

COOLING SYSTEM FOR ELECTRICAL EQUIPMENT

BACKGROUND OF THE INVENTION

The present disclosure relates to a cooling system for highly conductive electrical equipment.

Cryogenic refrigeration is critical in the operation of superconducting electrical equipment. Superconductor materials are required to be cooled below a critical temperature in order to decrease the resistivity, i.e. to zero in the DC case, of the material. The need for cryogenic refrigeration poses a practical problem in electrical networks that comprise several pieces of superconducting electrical equipment that each require low temperatures. A particular challenge is maintaining the low temperatures across an electrical network should a fault occur or maintenance be required in one piece of electrical equipment within the network.

In order to address this problem, electrical networks comprising several pieces of superconducting electrical equipment typically integrate a cooling system with each piece of electrical equipment. The superconducting systems (comprising the piece of electrical equipment and the cooling system) are connected together in a network. The intermediate electrical connectors between the superconducting systems are typically uncooled, e.g. at ambient temperature, so as to isolate the individual systems. Hence, throughout the network there are transitions from cold temperatures to ambient temperature and vice versa, as each piece of superconducting electrical equipment is traversed.

For an electrical network comprising several superconducting systems, the large number of transitions from ambient temperature to cold temperatures results in the electrical network being large and heavy, because each piece of electrical equipment requires its own cooling system, and because each superconducting system requires, at each of its ends, current leads which transition from the ambient temperature region to the cooled, superconducting region. Furthermore, the regions of ambient temperature can reduce the efficiency of the network since they incur a greater degree of resistive heating.

Whilst the intention of the individual sub-systems is to allow thermal/electrical isolation of one system from an adjacent system, e.g. to permit repair or replacement of one system without adverse effect to adjacent systems, it has been found that the large number of thermal transitions is a potential source of unreliability at a network level. It has been found that any single failure or fault affecting one piece of electrical equipment can have a detrimental effect on the effective operation of the pieces of equipment closely connected to it, despite the presence of uncooled intermediate connections.

It is an object of the present disclosure to provide a cooling system for electrical equipment that overcomes, or substantially mitigates, one or more of the above disadvantages associated with conventional systems. It may be considered an additional or alternative object of the present disclosure to provide a refrigeration system for a highly conductive electrical equipment network that offers an improvement in the robustness of the remainder of the network in the event that one or more pieces of equipment in the network become inoperative.

BRIEF SUMMARY OF THE INVENTION

According to a first aspect of the disclosure there is provided a cooled electrical conduction network comprising: an electrical network divided into two or more electrically conductive sections, each section comprising electrical equipment; and a cooling network for reducing the temperature of each section below ambient, wherein the electrical equipment and a corresponding portion of the cooling network of each section is housed in a section enclosure, the cooling network comprising a thermal interface located between each section, wherein the thermal interface is housed in an intermediate enclosure that is isolatable from the section enclosures in the electrical conduction network.

The cooling network may be a coolant network, which may maintain the temperature of a coolant, such as a fluid coolant, in each section. The coolant network may comprise a coolant flow and/or delivery network.

A portion of the cooling network may run through each section. The thermal interface may comprise a coolant interface.

The interior of the intermediate enclosure may be isolatable or isolated from the interior of the interior of the section enclosures. The intermediate enclosure, e.g. its interior, may be sealed or sealable off from one or more section enclosure in the electrical conduction network. The intermediate enclosure interior may be portioned off from one or two or more adjacent section enclosure.

The cooled electrical conduction network may comprise integrated and/or continuous electrical and coolant networks running through a plurality of enclosures, e.g. such that the integrated/continuous networks may be isolated from ambient conditions.

The coolant interface may comprise a coolant valve. A shut off valve or coolant breaker may be provided to allow isolation of one section of the coolant network from one or more further section via the coolant interface.

Each section enclosure or intermediate enclosure may be a sealed enclosure. Each enclosure may be maintained at a reduced pressure (i.e. below atmospheric/ambient pressure) in use. The pressure in each section enclosure and/or intermediate enclosure may be independently regulated/controlled. This may reduce the radiant heat load on the cooling system.

The section of the electrical and/or coolant network within the corresponding enclosure may be isolated, e.g. electrically insulated and/or fluidly isolated, from the enclosure interior. The section of the electrical and/or coolant network may pass through the enclosure interior, e.g. within a sheath or pipe.

The enclosure may comprise an inlet and/or outlet opening to allow passage of the electrical and/or coolant network into/through the enclosure. The integrated electrical and coolant networks may pass through a plurality of enclosures. The pressure within the coolant network section may be different to that within the enclosure.

Each enclosure may comprise a pressure regulation port or connector.

Each enclosure may comprise a pressure regulation valve. Gas and/or vacuum pressure within each enclosure may be controlled using the valve, e.g. by selectively exposing the enclosure interior to an applied, or ambient, pressure or vacuum.

The cooled conduction network may comprise a pressure/vacuum regulator for one or more enclosure, e.g. a gas pressure regulator. A common regulator may be provided for the plurality of section enclosures and/or intermediate enclosure(s). Each enclosure may be connected to the regulator via a valve, e.g. to allow selective communication or isolation of each enclosure from the regulator. A plurality of vacuum/pressure regulators may be provided for the conduction network, each regulator being connected to one or more section enclosure or intermediate enclosure.

The regulator may comprise one or more pump. The regulator may be arranged to evacuate one or more enclosure in use, e.g. selectively. The regulator may comprise a vacuum pump.

The regulator may be arranged to evacuate an internal space of the enclosure surrounding the liquid coolant network section and/or the electrical equipment contained within the enclosure.

Each section may be contained within a vacuum enclosure, such that each section comprises its own vacuum system.

Each enclosure may be accessible individually. Each enclosure may comprise a closure. The closure may be sealed shut in normal use. The closure may be selectively openable/removable in order that the interior of the enclosure, e.g. comprising the section of the electrical and/or coolant network, may be accessible, e.g. for inspection, removal or repair of equipment in that section.

The/each enclosure may be a rigid enclosure, e.g. defining a fixed internal volume. Each enclosure may comprise a plurality of rigid walls, e.g. in the form of a box structure.

Each section enclosure may or may not adjoin an adjacent enclosure (i.e. an intermediate enclosure or adjacent section enclosure). Each enclosure may or may not be connected to an adjacent enclosure in an end to end arrangement. Each section enclosure may share a common/adjoining enclosure wall with an adjacent enclosure.

The electrical conduction network may comprise a coolant source. The coolant source may comprise a refrigeration device/system for supplying coolant to one or more section of the coolant network.

The coolant source may be common to a plurality of, or each, section of the coolant network. Each section of the coolant network may be fluidly connected to the coolant source and/or one or more adjacent section. Each section may comprise a corresponding connection to the coolant source, which may comprise a valved connection.

Each section of the electrical network may comprise at least one disconnect switch, e.g. to provide for selective electrical isolation/disconnection of each section. Each section may comprise a plurality of disconnect switches.

The disconnect switch may be a circuit breaker. Alternatively, the disconnect switch may be an electrical isolator. The circuit breaker may have high thermal resistance when electrically open. The circuit breaker may reduce heat flow or 'in-leak' between sections in the case of a thermal and/or electrical fault in a section.

The electrical network may by AC or DC or a combination of both AC and DC.

The cooling network may be a cryogenic cooling network. The electrical equipment may be superconducting electrical equipment.

The coolant may comprise a cryogen, such as liquid neon, liquid hydrogen or liquid nitrogen. A liquid cooling system may be suitable for integration with electrical systems that comprise electrical equipment with a high temperature superconductor material. A liquid helium or pressurized gas helium cooling system may be used as an alternative, e.g. to achieve temperatures lower than those attainable by liquid nitrogen or liquid hydrogen cooling systems. A gaseous coolant system also represents an alternative fluid cooling system.

In other embodiments of the disclosure, the cooled conduction network may be used for cold, but not superconducting, systems. In such embodiments, the cooling system may be a liquefied natural gas cooling system or other liquefied gas.

The coolant interface and/or intermediate enclosure may provide a selectively operable thermal isolator at an end of a section, e.g. between that section and an adjacent section. The coolant interface may comprise a coolant circuit breaker. In the event of a fault occurring in a section, the coolant interface may provide selective thermal isolation between the faulted section and an adjacent section.

The intermediate enclosure may comprise a valve for connection to the pressure regulator. The coolant interface within the intermediate enclosure may comprise a cold head, e.g. a connection to the coolant source, in order to provide a thermal isolator section that may be thermally isolated and/or returned to a cold state independently of adjacent sections.

The length of each section/enclosure may be greater than the width of each section, e.g. being elongate in form. The length of each section may be greater than the length of the isolator section. One or more section may comprise an elongate coolant conduit, e.g. surrounding one or more electrical conductor that may be axially aligned with the conduit.

Connections to equipment operating at ambient temperature may be provided at ends of the network.

The electrical and/or coolant network may comprise a first electrical and/or coolant network. The cooled conducting network may further comprise a second electrical and/or coolant network. The second electrical and/or coolant network may comprise any, any combination, or all of the features of the first network. The second electrical and/or coolant network may be arranged as a parallel network to the first network. The second network may or may not be redundant in normal use and/or may provide redundancy in the cooled conducting network, e.g. for sections of the first network. One or more electrical or coolant connection between the first network and the second network may be established to bypass a section of the first network, e.g. in the event of a fault in a section of the first network. The second network may bear an electrical load and/or coolant flow when a section of the first system is under repair or otherwise isolated. The second network may additionally be operational in normal use, i.e. at the same time as normal operation of the first network.

According to a further aspect of the disclosure there is provided a cooled electrical conduction network comprising an electrical network divided two or more sections, each section comprising electrical equipment housed in a corresponding enclosure, the enclosure having a valve connecting the enclosure to a pump for evacuating the enclosure in use, and each section being connected to a fluid coolant supply system, wherein each section comprises at least one disconnect switch to provide electrical isolation from the one or more further sections of the electrical network.

BRIEF DESCRIPTION OF THE DRAWINGS

Practicable embodiments of the cooled electrical conduction network are described in further detail below by way of example only with reference to the accompanying drawings, of which.

DETAILED DESCRIPTION OF THE INVENTION

Figure 1:
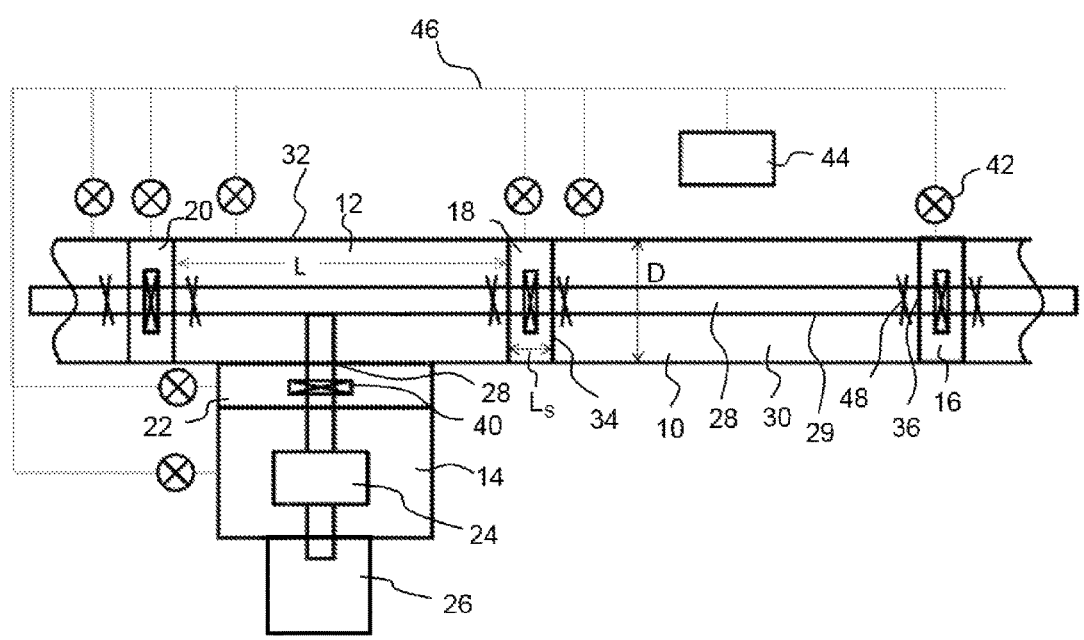
FIG. 1 shows a schematic plan view of a cooled electrical conduction network according to an example of the disclosure.

The cooled electrical conduction network comprises an electrical network and a fluid coolant network, wherein the coolant network operates in conjunction, e.g. in parallel, with the electrical network.

The cooled electrical conduction network comprises section enclosures 10, 12, 14, each enclosure comprising a section of the electrical network and a section of the coolant network. The enclosures 10, 12, 14 are rigid enclosures that can withstand an applied internal vacuum without substantial deformation or collapse.

Intermediate enclosures 16, 18, 20, 22 are provided between each separate enclosure in an end-to-end arrangement and are sealed off from the enclosures so as to provide a separate isolated interior space from the interior of the adjacent enclosures 10, 12, 14. The enclosures are sealed within outer rigid walls 32. End walls 34 are provided at each end of the enclosure, for partitioning the separate enclosures 10, 12, 14 and intermediate enclosures 16, 18, 20, 22.

Each enclosure may abut its adjacent intermediate enclosure, e.g. by sharing a common end wall 34 with an adjacent intermediate enclosure.

Each enclosure 10, 12, 14 defines a section of the fluid coolant network, which encloses a corresponding section of the electrical network, so as to house and permit cooling of the enclosed electrical section.

The sections of the electrical network comprise electrical equipment, such as electrical devices 24, i.e. requiring electrical connection to the network for operation, and/or connecting conductors, such as busbars or cables 28.

The intermediate enclosures 16, 18, 20, 22 are a length $L_s$, which is usually shorter than the length L of the enclosures 10, 12, 14. The length of each enclosure 10, 12, 14 is usually greater than the width D of that enclosure 10, 12, 14.

The electrical equipment in each section may be contained within a coolant vessel 29. In the example of a cable or busbar, the coolant fluid vessel 29 may take the form of a pipe. For other equipment, the vessel could take the form of a chamber surrounding the equipment or portion thereof. The coolant vessel thus provides a closed internal space that is exposed to the coolant and thereby maintained at suitably-cooled, e.g. cryogenic, temperature in use. The fluid coolant can allow heat generated by use of the electrical equipment to be carried away, thereby maintaining the desired operating temperature of the equipment.

The fluid vessel 29 is typically rigid so as to maintain a desired flow area for the coolant in use.

The fluid vessel 29 may be continuous through the section enclosures 10, 12, 14 and/or intermediate enclosures 16, 18, 20, 22, e.g. through corresponding openings therein. In such examples the openings in the relevant enclosure walls comprise a suitable seal so as to maintain the gas-tight nature of the enclosure. In other examples, the fluid vessel 29 may be formed in sections of defined length, e.g. length L shown in FIG. 1, which corresponds to the length of its section enclosure 12. Each section of the fluid vessel may thus be affixed at its end to the enclosure wall using a suitable flange formation or similar attachment. Thus whilst the vessel sections themselves may not be continuous, once attached for use, they form a continuous flow path through the enclosure sections 10-22.

Each enclosure comprises an inlet/outlet 36 at the end walls 34. The pipe/vessel 29 comprising sections of the electrical network and coolant network may pass through the inlet/outlets 36 of each enclosure, such that the electrical and coolant networks run through the enclosures. An inlet/outlet 38 is also provided in an outer wall 32 of enclosure 12, such that the vessel 29 may pass from enclosure 12 to enclosure 14, thereby providing branches of the network.

The coolant network comprises a refrigeration system. The refrigeration system comprises a coolant source 26 which provides fluid coolant to the coolant network. The coolant network comprises the coolant source 26 and the fluid vessels 29, thus forming a fluid communication network in which coolant can flow from the source 26 through any, any combination, or all of the fluid vessels 29 before returning to the fluid source 26. Typically a closed circuit is formed such that coolant can be refrigerated as it passes through the coolant source prior to communication around the network via vessels 29.

The fluid source 26 comprises a coolant reservoir and conventional refrigeration equipment, which will not be described in detail for conciseness as various refrigeration equipment options will be available to the skilled person in this field.

The fluid source 26 is shown here for simplicity as having a single connection to the coolant network, e.g. defining an out-and-back flow path through the coolant network. However in other examples the fluid source 26 may comprise separate fluid connections to each section of the network, e.g. akin to the vacuum pump 44 and its associated connections to be described below. In such examples, the fluid connection for each section typically comprises a valve, e.g. a shut-off valve or regulator, for selective control of flow to each section of the coolant network. A suitable manifold could be provided for the fluid source, e.g. with valved ports to each section, as required.

The electrical equipment and coolant network are thus confined within vessels 29, which are electrically and fluidly isolated from the interior space 30 of the enclosure. Whilst the enclosures 10-22 define different sections of the overall system, in normal operation the electrical equipment allows conduction through the entire electrical network. Similarly a single coolant source 26 may supply the entirety of the coolant network, thereby allowing continuous flow throughout. In other examples a plurality of coolant sources 26 may be provided, each supplying a plurality of sections of the network, or else it is possible that a dedicated coolant source could be provided for each section if necessary.

A closure (not shown) is provided in the wall 32 of the enclosure, typically a closure being provided for each enclosed section of the network, i.e. in each of enclosures 10, 12, 14 and optionally in each intermediate section 16, 18, 20, 22. The closure is sealed closed in normal use, but is removable in order that each enclosure is accessible by a user, e.g. for repair or maintenance.

The intermediate enclosures house a coolant shut off valve 40, which provides thermal isolation between the enclosures located either side of the intermediate enclosure, when required.

Each enclosure 10, 12, 14 and intermediate enclosure 16, 18, 20, 22 comprises a pressure regulation valve 42. A vacuum pump 44 is provided which is in connection, via a vacuum network 46, with each pressure regulation valve. The interior 30 of each enclosure can be selectively evacuated using the vacuum pump 44, either individually or collectively by control of the valves 42. Similarly the valves 42 for each enclosure may be individually isolated from the vacuum pump 44 and/or opened to ambient conditions to allow the interior 30 of each enclosure to be returned to ambient pressure, rather than vacuum conditions. A single vacuum pump is shown for simplicity although a plurality of vacuum pumps could be provided in other examples.

The inner surface of each enclosure could be provided with insulation, e.g. superinsulation or other low-emissivity, material. This may increase the thermal resistance with the enclosure exterior.

The application of a vacuum to each enclosure effectively allows each enclosure to thermally insulate the coolant and electrical network section contained therein.

Enclosure sections comprise electrical circuit breakers 48, which help to achieve electrical isolation of any section should it be required. The circuit breakers 48 have a high thermal resistance when electrically open, in order to reduce heat in-leak from other enclosures should a fault occur in an enclosure.

Connections (not shown) are provided at ends of the network, for connecting the electrical network to other electrical equipment, e.g. operating at ambient temperature or a separate cryogenic/cooled system.

In use, the circuit breakers 48 are closed and the coolant shut-off valves are open so as to allow the flow of current through the electrical network and the flow of coolant through the coolant network. The enclosure interiors are evacuated by vacuum pump 44 and the valves 42 can be closed to maintain the internal vacuum in each enclosure. The electrical system is thus insulated at a cooled, typically superconducting, state such that the electrical system can operate at a highly efficient state with minimal thermal/resistive loss. A pressure/vacuum sensor may be provided in each enclosure to ensure the desired vacuum is maintained. Suction can be applied as necessary by vacuum pump in the event of a gas leak into the enclosure interior 30.

If a fault occurs or access is required to any section of the network, the electrical circuit breakers 48 can be opened to electrically isolate the relevant section. Additionally or alternatively, the coolant shutoff valve 40 in either or both of the adjoining intermediate sections can be closed to thermally isolate the section from the coolant source 26. The vacuum within the enclosure interior 30 can be released by opening valve 42 to ambient. Thus a single section can be isolated thermally and electrically from the remainder of the system for repair replacement before reconnecting the section to restore normal use.

In certain embodiments of the invention, the sections could be constructed in a modular fashion, such that replacement of an entire section, i.e. both electrical and coolant, of the network can be undertaken by swapping the module.

Figure 2:
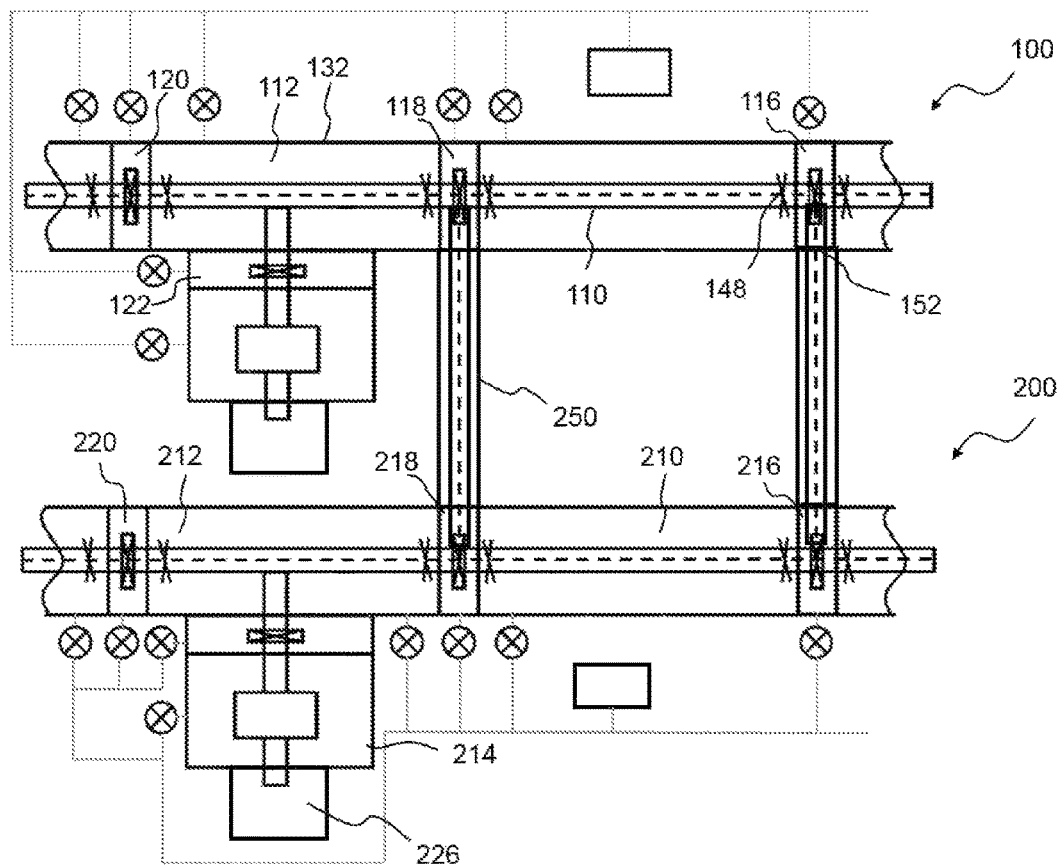
FIG. 2 shows a schematic plan view of a cooled electrical conduction network according to a second example of the disclosure.

In a second example of a cooled electrical conduction network, as shown in FIG. 2, first and second electrical and coolant networks 100, 200 are provided, which each comprise all the features of the electrical and coolant network described in relation to FIG. 1. Like features are identified using like numerals, where shown, but with the prefix '1' or '2' to denote the different systems. Those features will not be described again for conciseness and it can be assumed that the physical construction of each system 100 and 200 is as described above for FIG. 1.

The second electrical and coolant network 200 is arranged parallel to the first network 100. Connection sections 250 are provided between the first and second networks 100, 200 at appropriate locations, e.g. at intermediate sections thereof.

An outlet/inlet 152 is provided in the exterior rigid walls 132 of the intermediate enclosures 116, 118, 120, 122 of the first network 100. The connection sections 250 can connect the first electrical network 100 to the second electrical network 200 via the outlets 152 provided in the intermediate enclosures 116, 118, 120, 122. The connection sections 250 are cooled by the coolant network, of either a common coolant source or else the coolant source of either the first or second network. The connection sections could provide only electrical connection between the two networks 100, 200 or both electrical and coolant connections.

In normal use, the second electrical and coolant network 200 could be redundant or else could be operational. Should a fault occur in an enclosure of the first network 100, a corresponding section of the second network 200 can be electrically connected in parallel to that section of the first network 100, using connections 250, thereby providing a bypass for the faulty enclosure.

As shown by the example in FIG. 2, should a fault occur in the electrical equipment in enclosure 110, and a circuit breaker 148 cuts off the circuit in that enclosure, electrical connectors 250 are already permanently connected through the outlets 152 at intermediate enclosures 116 and 118. Enclosure 210, is therefore connected in parallel to enclosure 110, and acts as a bypass to enclosure 110. Should a fault occur in enclosure 112, connectors 250 could similarly connect intermediate enclosures 118, 120 of the first network 100 to intermediate enclosures 218, 220 of the second network, thereby enabling enclosure 212 to act as a bypass to enclosure 112.

Thus individual sections of the second network 200 can be functionally substituted for a faulty section of the first network 100 in order to allow ongoing use of the cooled electrical system, whilst the corresponding section of the first network 100 is offline.

The connection sections 250 in any example of the invention may be permanently installed in advance (e.g. during construction/installation of the system), may remain permanently installed, or may be connectable and removable as required. The coolant shutoff valve 40 (labelled in FIG. 1) may have an additional branching port to allow selective connection to the connection section 250 instead of the relevant normal adjacent network section. The branch port may be closed in normal use or may be open depending on the normal usage requirements of the second network 200.

A further electrical circuit breaker or switch could be provided at either or both ends of the connection section in FIG. 2.

Instead of the arrangement of FIG. 2, in which a full second network 200 (i.e. a 'shadow' network) is provided, one or more individual bypass sections could be provided, e.g. 210, 212, 214. The relevant bypass section 210, 212 or 214 could be connected at the relevant intermediate sections 116, 118, 120, 122 to bypass a section of the first network only as required. The bypass section could comprise suitable connection sections 250. This may avoid the need for a fully redundant network in favour of individual sections that can be swapped in or out as required.

A greater number of electrical connectors 250 may be provided should it be required that more than one enclosure in the second network 200 act as bypasses to corresponding enclosures in the first network 100.

In any examples of the invention, the control of the relevant valves may be automated based upon electrical, temperature and/or internal enclosure pressure sensor readings. Any or any combination of such sensors may be provided throughout the system, typically in each enclosure.

If a section of the network is automatically isolated, a suitable alert may be output such that an equipment operator can schedule the required inspection and or maintenance work to restore the section and network to its normal operational condition.

The invention disclosed herein is well suited to electrical systems used in conjunction with propulsion or other driven systems, such as for example aircraft or marine propulsion systems. The electrical equipment may thus comprise power delivery equipment for electrical propulsion or generation. An electrical machine may be included in the system, e.g. as an electrical device 24, but the invention is not limited to only such embodiments. The invention may equally be applicable to static driven and/or electrical generation systems, including pumping, turbine and other industrial machinery. Wider possible applications could include any industrial cryogenic cooling applications for electrical systems or networks in which individual sections of the network may require separate maintenance or overhaul, i.e. cryogenic shutoff, without jeopardising the operation and/or cooled status of other sections. Such systems may be referred to as 'complex' or 'partitionable' cooled electrical networks. The invention is best suited to networks in which such sections are co-located, rather than being distributed or geographically spaced.

The cooled electrical conduction network disclosed herein can offer any, or any combination, of the following benefits:

the electrical network and cryogenic coolant network are better integrated and/or controlled and may offer higher reliability;

the entire network can be retained at sufficiently low temperature for superconductivity, including the interface/connection between different sections of electrical equipment;

individual sections can be isolated from the cryogenic and/or electrical network as required, e.g. in response to a fault or for access, maintenance and/or replacement with minimal impact on the remaining sections;

transitions from cryogenic to ambient temperature through the electrical network are minimised or avoided altogether;

isolated cryogen circuit breakers allow thermal barriers and control between adjacent sections of the electric/cryogen network without loss of temperature and/or vacuum in the working sections;

the pressure in each section can be individually controlled.

While the principles have been described above with regard to a superconducting system they could equally be applied to a cold (but not superconducting) system such as, for example, those involving LNG (liquefied natural gas), liquid/gas hydrogen, liquid/gas nitrogen or other conventional fluid coolants. The invention may be applied to AC or DC systems alike.

Whilst the examples of the invention described above concern a fluid flow cooling system, cooling could otherwise be by cold heads or other non-flow driven cooling. Irrespective of the cooling method, the system is divided into a number of electrical/cooled sections any of which can be isolated, e.g. for maintenance/repair, without impairing the functioning of other sections.

The invention claimed is:

1. A cooled electrical conduction network comprising:
an electrical network divided into two or more conductive sections, each of the two or more conductive sections being connected to a respective electrical equipment having superconductor material that performs a respective operation during use; and
a coolant network for maintaining the temperature of a coolant in each of the two or more conductive sections,
wherein the electrical equipment and each of sections of the coolant network corresponding to each of the two or more conductive sections are housed in each of section enclosures of the cooled electrical conduction network, the coolant network comprising a coolant interface located between each of the two or more conductive sections,
wherein the coolant interface is housed in each of intermediate enclosures that is isolated from the section enclosures in the cooled electrical conduction network, and
wherein the electrical equipment is superconducting electrical equipment.

2. The cooled electrical conduction network according to claim 1, wherein the cooled electrical and coolant network continuous operate in normal operation and pass through the section enclosures and the intermediate enclosures.

3. The cooled electrical conduction network according to claim 1, wherein each of the intermediate enclosures has an enclosure interior, and each of the two or more conductive sections of the electric network and each of the sections of the coolant network within each of the section enclosures are isolated from the enclosure interior of neighboring intermediate enclosures and passes through the enclosure interior within a vessel.

4. The cooled electrical conduction network according to claim 1, wherein the coolant interface comprises a coolant valve for isolating one section of the coolant network from other sections of the coolant network.

5. The cooled electrical conduction network according to claim 1, wherein each of the section enclosures comprises a pressure regulation valve.

6. The cooled electrical conduction network according to claim 5, wherein the pressure in each of the section enclosures and/or each of the intermediate enclosures is independently regulated using the pressure regulation valve.

7. The cooled electrical conduction network according to claim 1, wherein each of the section enclosures has an interior housing, one of the two or more conductive sections of the electric network and one of the sections of the coolant network corresponding to the one of the two or more conductive sections, the interior housing is sealed shut in normal use and is selectively openable in order that the interior is accessible.

8. The cooled electrical conduction network according to claim 1, wherein the cooled electrical conduction network comprises a coolant source for cooling coolant in one or more of the sections of the coolant network.

9. The cooled electrical conduction network according to claim 1, wherein the coolant network is a cryogenic cooling network.

10. The cooled electrical conduction network according to claim 1, wherein each of the two or more conductive sections of the electrical network comprises at least one electrical disconnect switch.

11. The cooled electrical conduction network according to claim 1, comprising a bypass section, arranged to be conductively connected to one or more of the two or more conductive sections of the electrical network so as to allow selective isolation of one or more of the two or more conductive sections from a remainder of the two or more conductive sections of the electrical network.

12. The cooled electrical conduction network according to claim 11, wherein the bypass section comprises one or more fluid coolant connection to a corresponding one or more fluid coolant interface.

13. The cooled electrical conduction network according to claim 11, wherein the bypass section is permanently connected to the one of the two or more conductive sections and the bypass section and/or the connected one of the two or more conductive sections comprises an electrical disconnect switch for controlling electrical conduction with the bypass section.

14. The cooled electrical conduction network according to claim 1, comprising a first electrical and coolant network and further comprising a second electrical and coolant network having the same configuration of the first electric and coolant network, and the second electrical and coolant network being arranged as a parallel network to the first electrical and coolant network.

15. The cooled electrical conduction network according to claim 14, wherein one or more electrical or coolant connection is established between the first electrical and coolant network and the second electrical and coolant network to bypass a section of the first electrical and coolant network.

16. The cooled electrical conduction network according to claim 1, wherein each of the section enclosures of the cooled electrical conduction network is sealed within outer rigid walls and is separate from other section enclosures of the cooled electrical conduction network.

17. A method of servicing electrical equipment in a cooled electrical conduction network comprising:
an electrical network divided into at least a first conductive section and a second conductive section, each of the first and second conductive section being connected to a respective electrical equipment having superconductive material that performs a respective operation during use and a coolant network for maintaining the temperature of a coolant in each of the first and second conductive section;
wherein the electrical equipment and at least one of sections of the coolant network corresponding to one of the first and second conductive sections are housed in one of section enclosures;
the coolant network comprising a coolant interface located between each of the first and second conductive section;
wherein the electrical equipment is superconducting electrical equipment and the coolant interface is housed in an intermediate enclosure that is isolated from the section enclosures in the electrical conduction network;
the method comprising the step of thermally isolating the first conductive sections from the second conductive section at the coolant interface.

18. A method according to claim 17, wherein following the step of thermally isolating the first conductive section from the second conductive section a pressure in the intermediate section and only one of the first conductive section or the second conductive section is raised relative to the other of the first conductive section or the second conductive section.

19. A method according to claim 17, wherein each of the section enclosures of the cooled electrical conduction network is sealed within outer rigid walls and is separate from other section enclosures of the cooled electrical conduction network.

20. A cooled electrical conduction network comprising:
an electrical network divided into two or more conductive sections, each of the two or more conductive sections being connected to a respective electrical equipment having superconductor material that performs a respective operation during use; and
a coolant network for maintaining the temperature of a coolant in each of the two or more conductive sections,
wherein the electrical equipment and each of sections of the coolant network corresponding to each of the two or more conductive sections are housed in each of section enclosures of the cooled electrical conduction network, the coolant network comprising a coolant interface located between each of the two or more conductive sections,
wherein the coolant interface is housed in each of intermediate enclosures that is isolated from the section enclosures in the cooled electrical conduction network, and
wherein the coolant interface comprises a coolant valve for isolating one section of the coolant network from other sections of the coolant network.

* * * * *